(12) United States Patent
Schutten et al.

(10) Patent No.: US 6,242,925 B1
(45) Date of Patent: Jun. 5, 2001

(54) EMI SUSCEPTIBILITY TESTING APPARATUS AND METHOD

(75) Inventors: Michael Joseph Schutten; William George Earls, both of Schenectady, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/267,326

(22) Filed: Mar. 12, 1999

(51) Int. Cl.[7] .............................. G01R 27/28; G01R 31/28

(52) U.S. Cl. .......................... 324/627; 324/529; 324/530

(58) Field of Search ......................... 324/627, 95, 750, 324/751, 527, 528, 529, 530

(56) References Cited

U.S. PATENT DOCUMENTS 5,701,082 * 12/1997 Rogers ................................ 324/628

6,121,779 * 9/2000 Schutten et al. ..................... 324/627

OTHER PUBLICATIONS

"Bulk Current Injection System," MJ Schutten; WG Earls, Serial No. 09/134,800 (GE docket RD–26,172), filed Aug. 14, 1998.

* cited by examiner

Primary Examiner—Safet Metjahic
Assistant Examiner—James C. Kerveros
(74) Attorney, Agent, or Firm—Jill M. Breedlove; Douglas E. Stoner

(57) ABSTRACT

Non-destructive EMI susceptibility testing involves near-field injection of very high levels of instantaneous energy and low average power through localized injection of signals of very high field strength and low duty cycle. An electric field injector and a magnetic field injector are scanned, each in turn, over the equipment under test. For each injector, the amplitude and frequency of the induced localized electric or magnetic field, respectively, is varied such that the susceptibility locations, magnitudes, and frequencies can be identified and mapped. This approach localizes which section or subcircuit of the equipment under test is susceptible, the frequencies and field strengths of susceptibility, and whether susceptibility problems are created by magnetic fields, electric fields, or both.

12 Claims, 3 Drawing Sheets

EMI SUSCEPTIBILITY TESTING APPARATUS AND METHOD

BACKGROUND OF THE INVENTION

The present invention relates generally to electromagnetic interference (EMI) susceptibility testing.

Conventional EMI susceptibility testing methods involve subjecting electrical equipment under test (EUT) to large, externally radiated fields and to thereby attempt to create electromagnetically induced equipment failures. Such methods quantify EMI susceptibility for the equipment under test as a whole, but provide no information on a particular failure mechanism; hence, it is very difficult to pinpoint which subcircuit is failing in the EUT. Furthermore, such methods require application of a large external field, sometimes destroying the EUT before the non-destructive susceptibility level can even be determined. Moreover, it is often difficult to externally generate the large fields required to induce failure in the EUT.

Another approach to EMI susceptibility testing involves bulk current injection (BCI), i.e., the injection of high-frequency currents into harness wires. BCI also allows for quantification of the overall board susceptibility, but as with the methods described hereinabove, it is difficult with BCI to determine which subcircuit is actually failing. And continuous energy applied using BCI can likewise destroy the EUT.

Accordingly, it is desirable to provide non-destructive EMI susceptibility testing of electrical equipment which allows for quantification of equipment susceptibility and which provides information regarding particular failure mechanisms of the EUT.

BRIEF SUMMARY OF THE INVENTION

Non-destructive EMI susceptibility testing involves near-field injection of very high levels of instantaneous energy and low average power. More specifically, this involves localized injection of signals of very high field strength and low duty cycle. An electric field (E-field) injector and a magnetic field (H-field) injector are scanned, each in turn, over the EUT. For each injector, the amplitude and frequency of the induced localized electric or magnetic field, respectively, are varied such that the susceptibility locations, magnitudes, and frequencies of the EUT can be identified and mapped. This allows simple, low-cost board modifications for the EUT for improving EMI susceptibility. Furthermore, this approach localizes which section or subcircuit of the EUT is susceptible, the frequencies and field strengths of susceptibility, and whether susceptibility problems are created by magnetic fields, electric fields, or both.

DETAILED DESCRIPTION OF THE INVENTION

Figure 1:
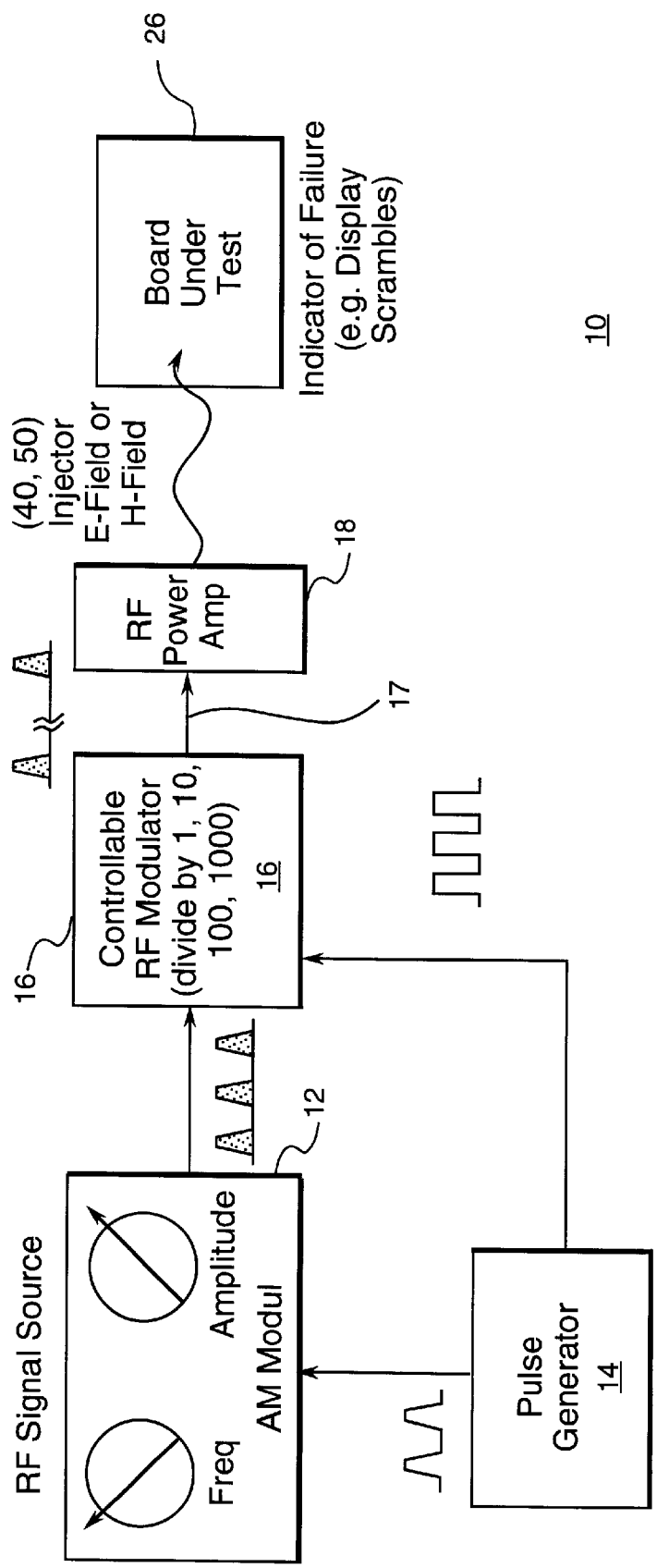
FIG. 1 is a block diagram illustrating EMI susceptibility testing apparatus in accordance with preferred embodiments of the present invention.

FIG. 1 illustrates EMI susceptibility testing apparatus 10 in accordance with preferred embodiments of the present invention. A radio frequency (RF) signal source 12 provides a signal having a single controllable frequency and controllable amplitude. A pulse generator 14 is used with the RF signal source to create an AM envelope for the single frequency sinusoid. Outputs from the RF signal source and the pulse generator are provided to a controllable RF modulator 16 with a user-controllable low-to-high effective duty cycle. This modulated RF output 17 is applied to the input of an RF power amplifier 18. The output of the RF power amplifier energizes E-field injectors 40 and H-field injectors 50, which are connected to the RF amplifier output using a flexible coaxial cable. The injectors induce single frequency, localized, high-frequency near-field electric or magnetic fields into the EUT 26.

It is desirable to induce large electric and magnetic field levels over a range of frequency values with a low effective duty cycle into the EUT. The low duty cycle ensures that equipment is not damaged due to a high induced energy level. Furthermore, the low effective duty cycle represents the transient nature of many EMI induced events.

Figure 2:
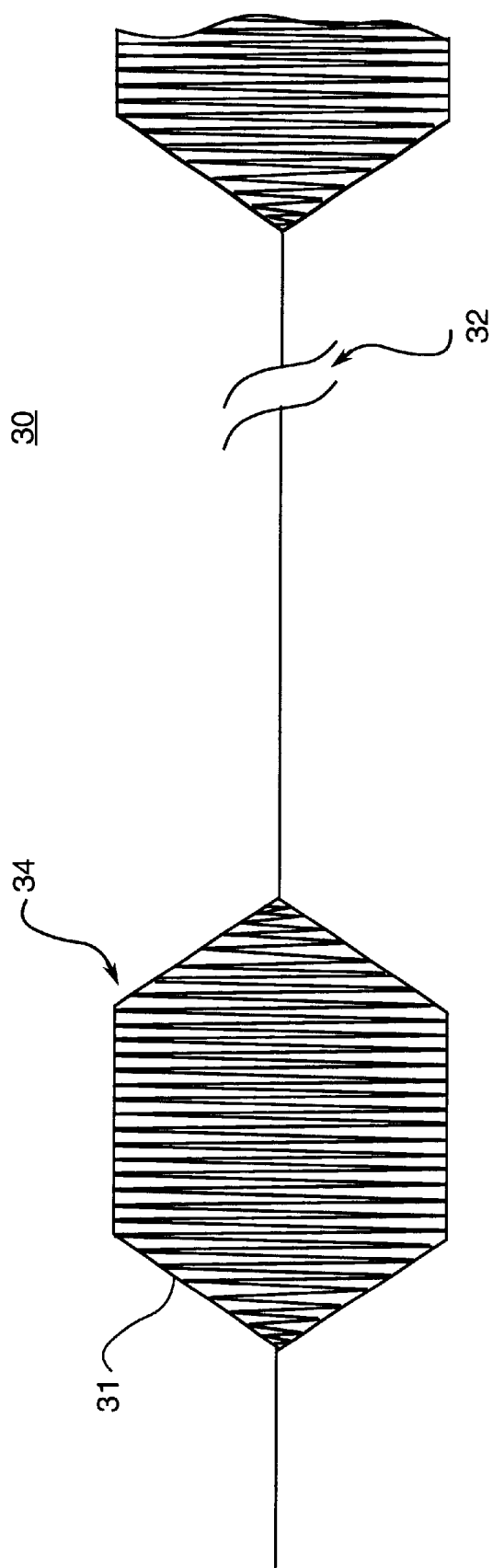
FIG. 2 graphically illustrates a modulated RF signal input to E-field and H-field injectors in accordance with preferred embodiments of the present invention.

FIG. 2 illustrates an exemplary electrical time domain signal 30 applied to the injectors by the RF power amplifier. A single sinusoidal signal having a user-controllable frequency (e.g., 1 MHz to 1 GHz) is amplitude modulated. The RF signal on-time can be varied in a range from a continuous signal to about 0.05% duty cycle based upon test setup settings. The break 32 in FIG. 2 indicates a relatively long time between pulses. Specifically, the RF modulator 16 allows the on-time 31 to be controlled, and allows the off-time 32 to be adjusted between a small to very large off-time.

The modulation envelope 34 has slow fixed rise and fall times, thereby eliminating frequencies other than the intended injection frequency for the E-field or H-field. The AM envelope shape remains substantially the same for all testing, but the amplitude of the AM envelope is controllable. The modulated high frequency can vary between, for example, 1 and 1000 MHz.

Figure 3:
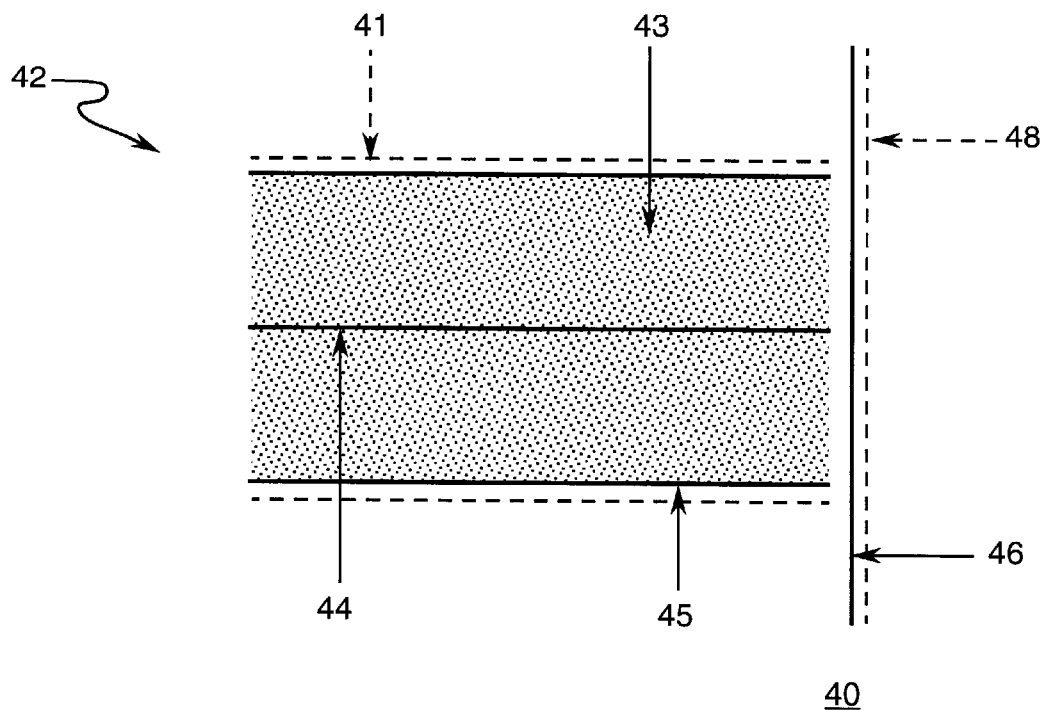
FIG. 3 illustrates by cross section an E-field injector in accordance with preferred embodiments of the present invention.

FIG. 3 illustrates a side, cross sectional view of an E-field injector 40 in accordance with preferred embodiments of the present invention. The E-field injector comprises a BNC cable 42 having a cable sheath 41, cable insulation 43, a center conductor 44, and an outer conductor 45. The center conductor is connected to an E-field injection surface 46, e.g., a copper plate. The BNC outer conductor 45 is electrically isolated from the injection surface 46, but is constructed to be close to the injection surface. This minimizes E-fields on the back sided of the injector. Injection surface 46 is attached to an insulator 48, e.g., made of plastic. The injection surface 46 functions like one plate of a capacitor. By energizing the E-field injector with the apparatus of FIG. 1, a large E-field (and virtually no H-field) is emitted from the injection surface. The energized E-field injector is placed in close proximity with each particular section or subcircuit of the EUT, with the plastic insulator 48 ensuring that no conductive contact is made, only electric field coupling. The E-field falls off very rapidly with increased spacing from the injection plate, allowing for localized E-field injection. Localized field levels of zero to in excess of 10000 V/m, for example, can be obtained using E-field injectors, or probes. The geometry (e.g., size and shape) of the E-field injectors may be modified for E-field injection into particular portions of the EUT.

Figure 4:
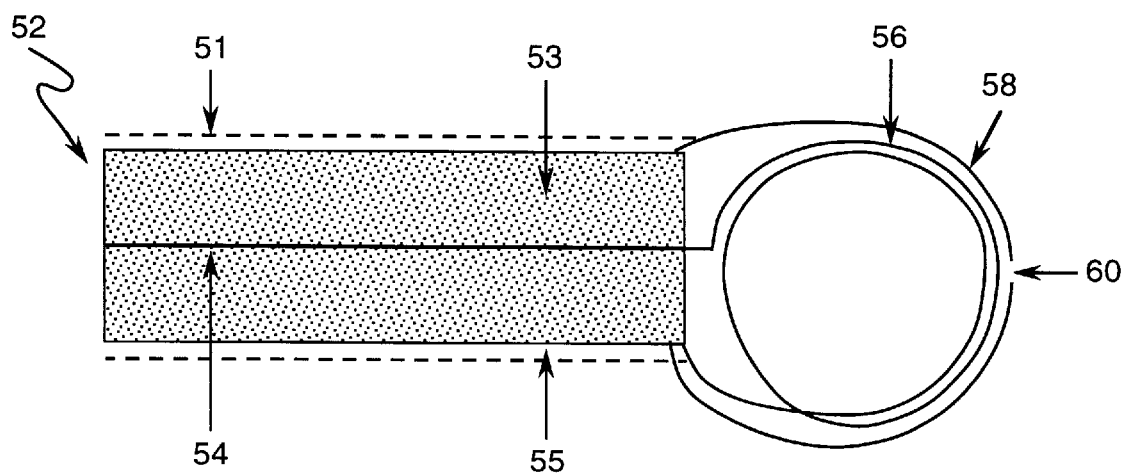
FIG. 4 illustrates by cross section an H-field injector in accordance with preferred embodiments of the present invention.

FIG. 4 illustrates a side, cross sectional view of an H-field injector 50 in accordance with preferred embodiments of the present invention. Like the E-field injector of FIG. 3, the H-field injector of FIG. 4 comprises a BNC cable 52 having a cable sheath 51, cable insulation 53, a center conductor 54, and an outer conductor 55. As illustrated, the H-field injector of FIG. 4 has one or more closed loop turns 56 connecting the center conductor 54 of the BNC cable to the BNC outer conductor 55. Conductive current in the H-field injector creates a magnetic field. An electrostatic shield 58, having a gap 60, is placed over the top portion of the loops in order to reduce unintended radiated E-fields. An insulator, e.g., a plastic spacer, is attached onto the H-field injector so that it can be placed in very close proximity to the section or subcircuit of the EUT. As design considerations, turns of larger diameter inject the H-field over a larger surface area. The geometry (e.g., size and shape) of the H-field injectors may be modified for H-field injection into particular portions of the EUT. For example, noncircular turns (e.g., rectangular turns) may be employed. The H-field falls off very rapidly with increased spacing from the injection turns, allowing for localized H-field injection. Such H-field probes can induce localized fields of zero up to 1000 A/m, for example.

Importantly, the E-field injector should have the capability to emit a very large E-field with very little H-field. Similarly, the H-field injector should have the capability to emit a very large H-field with very small E-fields. This helps determine the cause (and hence the solution) to improve EUT robustness.

Additionally, by using conventional calibrated E-field and H-field detection probes, the injection probes may be calibrated so as to provide absolute field injection data, rather than relative information.

EMI susceptibility apparatus in accordance with preferred embodiments of the present invention may be automated. For example, the board under test of FIG. 1 can be situated on a flat surface with E-field and H-field injectors mounted therebeneath. With a fixed injection frequency and amplitude level set, a stepper motor assembly moves the localized injector over the surface of the EUT. The amplitude is increased until either failure occurs or a maximum test limit is reached. The frequency is then increased, and the process is repeated. A susceptibility map can thus be created by automated apparatus for all frequencies of interest and for all desired locations for the EUT.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. Apparatus for testing the EMI susceptibility of electrical equipment, comprising:
   a radio frequency signal source for providing a single-frequency signal having a controllable frequency and a controllable amplitude;
   a pulse generator for providing an AM envelope for each single-frequency signal from the radio frequency signal source;
   a controllable radio frequency modulator for receiving each AM envelope and for generating therefrom a modulated AM signal with a controllable duty cycle and controllable rise and fall times, the duty cycle being controlled to provide a long off-time relative to an on-time in order to provide relatively high levels of instantaneous energy and low average power; and
   E-field and H-field injectors for receiving the modulated AM signal from the radio frequency modulator and for injecting E-fields and H-fields, respectively, into the electrical equipment under test, by near-field scanning of the electrical equipment without electrical contact between the injectors and the electrical equipment, while varying the magnitude, duty cycle, frequency, and location of the injected fields.

2. The apparatus of claim 1 wherein the signal provided by the radio frequency signal source is sinusoidal.

3. The apparatus of claim 1 wherein the duty cycle is controllable in a range from about 100% to less than about 0.1%.

4. The apparatus of claim 1 wherein the E-field injector comprises a BNC cable having a center conductor connected to an E-field injection surface, the injection surface being attached to an insulator.

5. The apparatus of claim 1 wherein the H-field injector comprises a BNC cable having a center conductor and an outer conductor and one or more closed-loop turns connected thereto.

6. The apparatus of claim 5 wherein the H-field injector further comprises a Faraday shield covering a portion of the turns for reducing E-fields radiated therefrom.

7. A method for testing the EMI susceptibility of electrical equipment, comprising:
   providing a single-frequency signal having a controllable frequency and a controllable amplitude;
   providing an AM envelope for each single-frequency signal;
   modulating each single-frequency envelope and generating therefrom a modulated AM signal with a controllable duty cycle and controllable rise and fall times, the duty cycle being controlled to provide a long off-time relative to an on-time in order to provide relatively high levels of instantaneous energy and low average power; and
   injecting E-fields and H-fields, respectively, into the electrical equipment under test using E-field and H-field injectors, respectively, by near-field scanning of the electrical equipment without electrical contact between the injectors and the electrical equipment, while varying the magnitude, duty cycle, frequency, and location of the injected fields.

8. The method of claim 7 wherein the signal having a single controllable frequency and a controllable amplitude is sinusoidal.

9. The method of claim 7 wherein the duty cycle is controllable in a range from about 100% to less than about 0.1%.

10. The method of claim 7 wherein the E-field injector comprises a BNC cable having a center conductor connected to an E-field injection surface, the injection surface being attached to an insulator.

11. The method of claim 7 wherein the H-field injector comprises a BNC cable having a center conductor and an outer conductor and one or more closed-loop turns connected thereto.

12. The method of claim 11 wherein the H-field injector further comprises a electrostatic shield covering a portion of the turns for reducing E-fields radiated therefrom.

* * * * *

UNITED STATES PATENT AND TRADEMARK OFFICE
CERTIFICATE OF CORRECTION

PATENT NO.    : 6,242,925 B1
DATED         : June 5, 2001
INVENTOR(S)   : Schutten et al.

It is certified that error appears in the above-identified patent and that said Letters Patent is hereby corrected as shown below:

<u>Column 2,</u>
Line 49, delete "sided" and insert therefor -- side --.

<u>Column 4,</u>
Line 62, delete "a electrostatic" and insert therefor -- an electrostatic --.

Signed and Sealed this

Twenty-fourth Day of June, 2003

JAMES E. ROGAN
*Director of the United States Patent and Trademark Office*